(12) United States Patent
Bourdelle et al.

(10) Patent No.: US 7,229,898 B2
(45) Date of Patent: Jun. 12, 2007

(54) METHODS FOR FABRICATING A GERMANIUM ON INSULATOR WAFER

(75) Inventors: Konstantin Bourdelle, Crolles (FR); Fabrice Letertre, Grenoble (FR); Bruce Faure, Grenoble (FR); Christophe Morales, Pont (FR); Chrystel Deguet, Saint Ismier (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 163 days.

(21) Appl. No.: 11/029,808

(22) Filed: Jan. 4, 2005

(65) Prior Publication Data

US 2006/0110899 A1    May 25, 2006

(30) Foreign Application Priority Data

Nov. 19, 2004   (EP) .................... 04292742

(51) Int. Cl.
*H01L 21/30* (2006.01)
(52) U.S. Cl. .................. 438/455; 438/458; 438/478; 257/E23.001
(58) Field of Classification Search ............. 438/455, 438/458, 478; 257/352
See application file for complete search history.

(56) References Cited

U.S. PATENT DOCUMENTS 5,374,564 A    12/1994   Bruel ................. 437/24
6,995,430 B2 *  2/2006   Langdo et al. ........... 257/352
2004/0005740 A1  1/2004   Lochtefeld et al. ......... 438/149
2005/0106893 A1 * 5/2005  Wilk .................. 438/758
2005/0148122 A1  7/2005   Yonehara ............... 438/149

FOREIGN PATENT DOCUMENTS

WO    WO 2004/100268 A1    11/2004

OTHER PUBLICATIONS

Thomas N. Jackson, "Gate- Self-Aligned p-Channel Germanium MISFET's", IEEE Electron Device Letters. vol. 12, No. 11, pp. 605-607 (1991).
Chi On Chui et al., "A Germanium NMOSFET Process Integrating Metal Gate and Improved Hi-k Dielectrics", IEEE, (2003).

(Continued)

*Primary Examiner*—Asok K. Sarkar
*Assistant Examiner*—Victor V. Yevsikov
(74) *Attorney, Agent, or Firm*—Winston & Strawn LLP

(57) ABSTRACT

Improved fabrication processes for manufacturing GeOI type wafers are disclosed. In an implementation, a method for fabricating a germanium on insulator wafer includes providing a source substrate having a surface, at least a layer of germanium and a weakened area. The weakened area is located at a predetermined depth in the germanium layer of the source substrate and is generally parallel to the source substrate surface. The technique also includes providing a germanium oxynitride layer in or on the source substrate, bonding the source substrate surface to a handle substrate to form a source-handle structure, and detaching the source substrate from the source-handle structure at the weakened area of the source substrate to create the germanium on insulator wafer having, as a surface, a useful layer of germanium.

20 Claims, 2 Drawing Sheets

OTHER PUBLICATIONS

T. Busani et al., "Growth and characterization of $GeO_2$ films obtained by plasma anodization of epitaxial Ge films," Journal of Applied Physics, 85(8): 4262-4264 (1999).

Z.-Y. Cheng et al., "SiGe-On-Insulator (SGOI): Substrate preparation and MOSFET fabrication for electron mobility evaluation," 2001 IEEE International SOI Conference (2 pages).

Chi On Chui et al., "Atomic layer deposition of High-κ dielectric for germanium MOS applications—substrate surface preparation," IEEE Electron Device Letters, 25(5): 274-276 (2004).

H. Shang et al., "Electrical characterization of germanium p-channel MOSFETs," IEEE Electron Device Letters, 24(4): 242-244 (2003).

Q.Y. Tong et al., Extracts of "Semi-Conductor on Wafer Bonding," Science and Technology, John Wiley & Sons, Inc., pp. 1-15, 80-99.

Y. Wang et al., "Electron cyclotron resonance plasma and thermal oxidation mechanisms of germanium," J. Vac. Sci. Technol. A, 12(4): 1309-1314 (1994).

S. Zhaoqi et al., "Plasma anodic oxidation and nitridation of Ge(111) surface," Semicond. Sci. Technol., 8: 1779-1782 (1993).

A.J. Auberton-Herve et al., "Why Can Smart Cut® Change The Future of Microelectronics?", International Journal of High Speed Electronics and Systems,., vol. 10, No. 1, pp. 131-146 (2000).

* cited by examiner

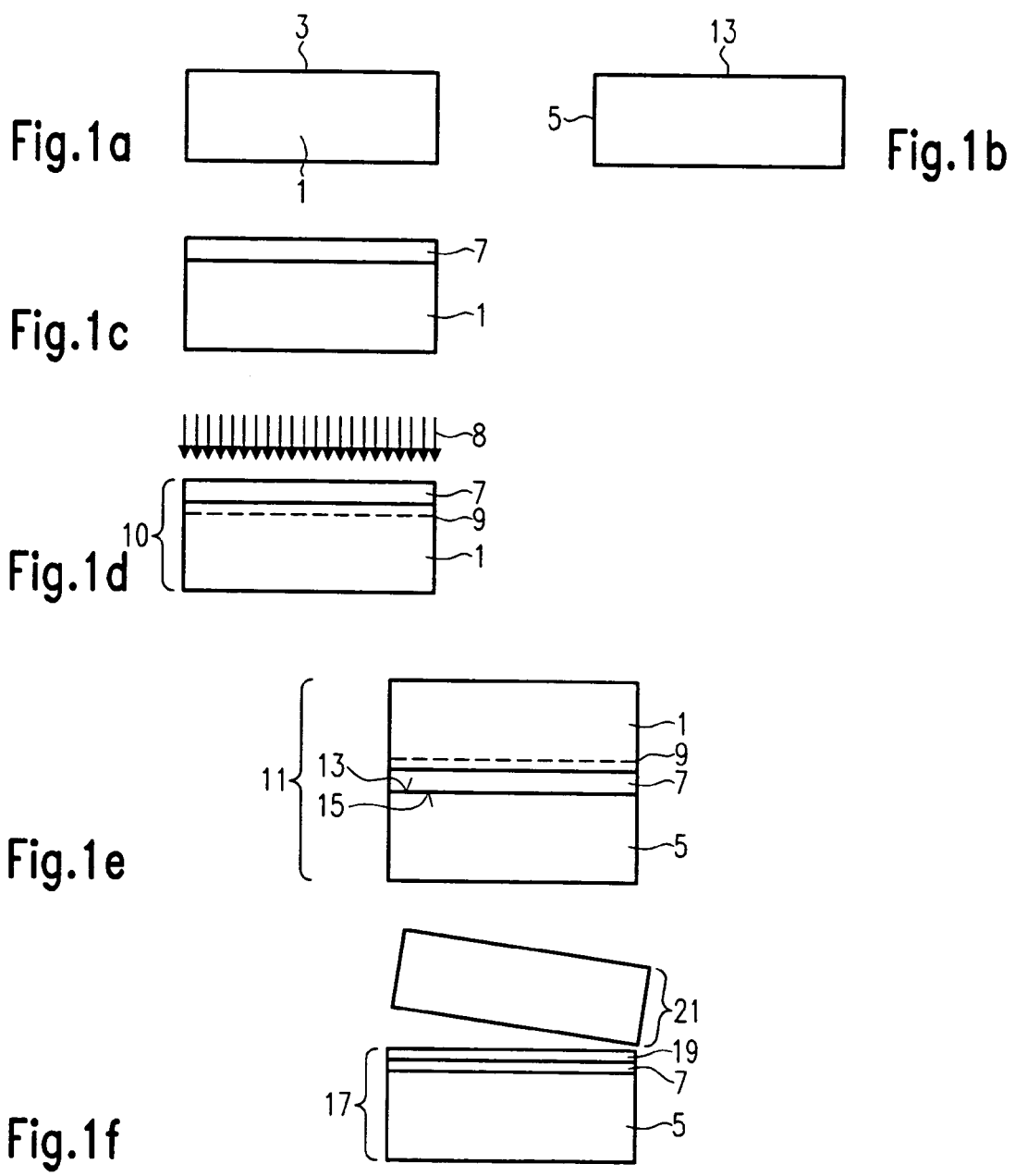

METHODS FOR FABRICATING A GERMANIUM ON INSULATOR WAFER

BACKGROUND OF THE INVENTION

The invention relates to methods for fabricating a germanium on insulator (GeOI) type wafer.

Germanium is an interesting material to use when fabricating semiconductor devices because of its high mobility characteristics for electrons and holes. Currently, more silicon devices are being fabricated on silicon on insulator (SOI) type wafers to prevent leakage currents, and the same trend is occurring with respect to devices grown on germanium. The major difference between silicon and germanium is the fact that, unlike stable silicon dioxide, native germanium oxide is not stable enough to be the dielectric in a GeOI type wafer. To overcome this problem, silicon dioxide-like layers have been proposed for use as the dielectric, such as low temperature oxide (LTO) layers, silicon dioxide made from TEOS or SiH4, tetra-ethyl-ortho-silicate (TEOS) or high temperature oxides (HTO), or non oxide-like layers such as silicon nitride ($Si_3N_4$) or germanium nitride ($Ge_3N_4$). These layers are usually deposited by a low pressure chemical vapor deposition (LPCVD) process, or by a plasma enhanced chemical vapor deposition (PECVD) process. The dielectrics are deposited on a bulk germanium wafer or, for instance, on a thin germanium layer which has previously been provided on another type of wafer such as a silicon wafer or a silicon carbide wafer, which are cheaper than a germanium wafer.

Depositing an auxiliary dielectric layer, however, causes several problems. First, depositing an auxiliary layer of a dielectric material means that the interface layer between the $SiO_2$ layers and Ge layer is not well controlled. The quality of the interface depends on the type of surface preparation conducted on the Ge layer prior to deposition (such as cleaning). Second, it is necessary to carry out a thermal annealing in order to improve the structural as well as the electrical properties of the deposited layers. Third, the deposited layers exhibit increased roughness as compared to thermally grown layers, and therefore polishing is necessary in order to improve the surface quality of the deposited and annealed oxide. During fabrication of a GeOI wafer the surface quality of the dielectric layer plays an important role because this surface is next bonded to a handle substrate.

Conventionally, a GeOI type wafer is created by providing a source substrate, like a germanium (Ge) substrate or a substrate that includes an epitaxial germanium layer, with the deposited, annealed and polished dielectric layer on one main surface. Next, the structure is attached to a handle substrate to form a source-handle structure, and then a thin Ge layer is transferred together with the dielectric layer onto the handle substrate by detaching a portion of the source substrate at a previously created weakened area. The weakened area is generally parallel to a main surface of the source substrate. Because the native germanium oxide cannot be used as a dielectric on a GeOI type wafer, and because other types of oxides or nitrides need to be deposited, annealed and polished, typically such GeOI wafers suffer from low quality dielectric films, a low production through-put, and as a further consequence a high cost per wafer.

SUMMARY OF THE INVENTION

Improved fabrication processes for manufacturing GeOI type wafers are disclosed that overcome the abovementioned problems concerning the dielectric material. In particular, an aspect of the invention for fabricating a germanium on insulator wafer includes providing a source substrate having a surface, at least a layer of germanium and a weakened area. The weakened area is located at a predetermined depth in the germanium layer of the source substrate and is generally parallel to the source substrate surface. The method also includes providing a germanium oxynitride layer in or on the source substrate, bonding the source substrate surface to a handle substrate to form a source-handle structure, and detaching the source substrate from the source-handle structure at the weakened area of the source substrate to create the germanium on insulator wafer having, as a surface, a useful layer of germanium.

In an advantageous implementation, the source substrate is entirely made of germanium. Beneficially, the predetermined weakened area is created prior to the bonding step by implanting atomic species through the source substrate surface. In a variation, the germanium oxynitride layer is provided by treating the surface layer of the source substrate, wherein the surface layer is germanium or germanium oxide, followed by a treatment to introduce nitrogen into the germanium oxide layer.

In another variation, the surface layer of the source substrate is germanium and the germanium oxynitride layer is provided by first forming a germanium oxide layer on the germanium surface layer, followed by a treatment to introduce nitrogen into the germanium oxide layer. In addition, the germanium oxide layer is formed by thermally growing the germanium oxide layer on germanium, by oxidizing the germanium layer surface or by allowing a native germanium oxide layer to form by contact of the germanium surface layer with ambient air. In an advantageous embodiment, the germanium oxynitride layer is provided by applying a nitridation process to the germanium oxide layer. The nitridation process may include applying at least one of ammonia, $NO_2$, or NO to the germanium oxide layer. Advantageously, the method also includes cleaning the germanium layer surface with cyclic fluoric acid prior to forming the germanium oxide layer. The germanium oxynitride layer may advantageously be formed by using a rapid thermal nitridation process. In an embodiment, the rapid thermal nitridation process includes heating the source substrate in an ammonia atmosphere at about 600° C. for about 1 minute.

In a variation, the method includes implanting at least one of N ions or $N_2$ ions into the germanium oxynitride layer. Beneficially, the method further includes, prior to bonding, activating a surface of the germanium oxynitride layer by plasma activation. In an embodiment, the germanium surface layer has a thickness of no greater than about 20 Å. The handle substrate may be made of at least one of germanium, silicon, thermally grown silicon dioxide on silicon, silicon carbide, gallium arsenide, or quartz.

In another advantageous aspect according to the invention, at least one additional layer is provided on the germanium oxynitride layer as the surface layer of the source substrate prior to forming the source-handle structure. The additional layer may be a deposited silicon dioxide layer and is provided prior to preparing the predetermined weakened area. In a beneficial implementation, a second additional layer is provided on the germanium oxynitride layer prior to providing the additional layer. The second additional layer may be at least one of $HfO_2$ or $Si_3N_4$.

In a further aspect according to the invention, a germanium on insulator wafer is provided. The germanium on insulator wafer includes a germanium useful layer, a germanium oxynitride layer, and a handle substrate.

Advantageously, the germanium on insulator wafer further includes an additional layer made of $SiO_2$ that is positioned between the germanium oxynitride layer and the handle substrate. The germanium on insulator wafer may also include a second additional layer at least one of $HfO_2$ or $Si_3N_4$ positioned between the germanium oxynitride layer and the additional layer.

BRIEF DESCRIPTION OF THE DRAWINGS

Other aspects, purposes and advantages of the invention will become clear after reading the following detailed description with reference to the attached drawings, in which:

FIGS. 1a to 1f illustrate a first embodiment of the method for fabricating a germanium on insulator type wafer according to the invention.

DETAILED DESCRIPTION OF THE PREFERRED EMBODIMENTS

Figure 2A:
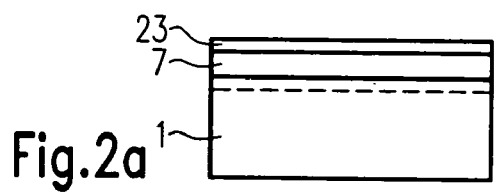
FIGS. 2a to 2f illustrate a second embodiment of the method for fabricating a germanium on insulator type wafer according to the invention.
Figure 2B:
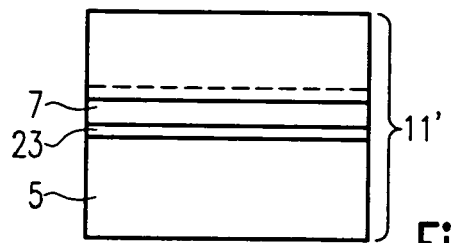

It is to be noted that a germanium oxynitride ($GeO_xN_y$) layer provided on or in one main surface of a germanium substrate offers several advantages. A germanium/germanium oxynitride interface has very good electrical characteristics compared to dielectric layers used in conventional GeOI wafers. The germanium oxynitride interface is the interface between the $GeO_xN_y$ and the germanium upon which it was formed. In addition, the germanium oxynitride surface satisfies wafer bonding criteria with respect to surface roughness, nanotopology, side flatness and particle density, and therefore can be easily bonded with the handle substrate.

The good electrical characteristics of the germanium oxynitride interface have been recognized and used in germanium-based CMOS structures. For example, such a structure was described in T. N. Jackson et al., IEEE Electron Device letters, Vol. 12, page 605, 1991, and C. O. Chui et al., IEDM 2003 Technical Digest, page 437, 2003. Surprisingly, the $GeO_xN_y$ layer is also compatible with the attaching and detaching steps of the GeOI wafer fabrication process, and thus facilitates the overall fabrication process and improves the cost per wafer.

A method for fabricating a germanium on insulator type wafer according to the invention will now be described in the context of using SMART-CUT® technology. However, it should be understood that other suitable semiconductor on insulator manufacturing methods can also be adapted to provide the same results.

FIG. 1a illustrates a germanium (Ge) substrate 1 or, as a variant, a substrate with an epitaxial germanium layer provided on one of its main surfaces. The surface 3 of the source substrate may be cleaned by using, for example, a cyclic fluoric acid (CHF) prior to further processing.

FIG. 1b illustrates a handle substrate 5. The handle substrate can be, for example, a germanium wafer, a silicon wafer, a silicon wafer with a thermally grown silicon dioxide layer, a silicon carbide wafer, a wafer presenting a silicon germanium front surface or a gallium arsenide wafer. A quartz-type wafer could also be used. Both the source substrate 1 and the handle substrate 5 may be of any suitable size or form such as, for example, a 200 mm wafer or a 300 mm wafer.

FIG. 1c illustrates an important step in the process for fabricating a germanium on insulator wafer, which is to provide a germanium oxynitride layer 7 on or in the main surface 3 of the Ge substrate 1. In this embodiment, a natural germanium oxide is thermally grown on top or in a main surface 3 of the Ge substrate 1, by oxidizing a surface layer of the Ge substrate 1, to obtain the germanium oxynitride layer 7. This is achieved at a temperature of about 550° C. in an oxygen-containing atmosphere. The germanium oxide layer is usually grown to a thickness in the range of about 500 Å to about 3000 Å, and in particular to have a thickness of about 1500 Å. Next, a nitridation step is conducted which, for example, occurs at a temperature of about 350° C. During the nitridation step, the temperature may be raised up to about 600° C. in an ammonia ($NH_3$) containing atmosphere. As a variant, nitrogen dioxide or nitrogen monoxide ($NO_2$ or $NO$) may be used to achieve nitridation. Such a process may take from about 10 minutes to a couple of hours depending on the thickness of the material being treated. A germanium oxynitride layer having a thickness in the range of about 500 Å to about 3000 Å, in particular with a thickness of about 1500 Å, is thus formed. Under these conditions mainly stoichiometric $GeN_2O$ is obtained. However, non stoichiometric germanium oxynitrides can also be obtained with the proposed method by varying one or more of the abovementioned process parameters. The thermally grown oxide has good surface characteristics and the nitridation process has no impact or only a limited impact on the surface quality, and thus a good interface surface for a subsequent bonding step is achieved.

Instead of thermally growing the germanium oxide layer, it is also possible to use an electron cyclotron resonance plasma technique or a plasma anodic oxidation technique to grow the germanium oxide layer. Oxide growth can then be conducted at temperatures in the range of about 80° C. to about 400° C., to obtain a higher oxide growth rate of about four times as compared to thermal oxidation at similar growth temperatures. It is further possible to implant N or $N_2$ ions into the germanium oxide or the germanium oxynitride layer. The dose and energy of the ions is chosen depending on the desired stoichiometry to be achieved, and on the thickness of the implanted layer.

According to a variant, a germanium oxynitride layer 7 of about 100 Å may be obtained by using rapid thermal nitridation. Rapid thermal nitridation consists of placing either the germanium or the germanium oxide in an ammonia ($NH_3$) atmosphere and heating to about 600° C. for about 1 minute. According to another variant, the germanium oxide could also consist of a native oxide (with a thickness of between about a few Å to about a few 10's of Å) that resides on the Germanium wafer surface when it has been exposed to ambient air.

FIG. 1d illustrates a subsequent step wherein a predetermined weakened area 9 is created inside the source substrate 1. The weakened area may be created through the germanium oxynitride layer 7, and it is essentially parallel to the main surface 3. SMART-CUT® technology could be used, which includes implanting atomic species 8, for instance hydrogen ions, with a predetermined energy and dose into the source substrate 1.

FIG. 1e illustrates the bonding of the handle substrate 5 to the germanium oxynitride layer 7 of the source substrate 1 to create the source-handle structure 11. Bonding occurs between one of the main surfaces 13 of the handle substrate 5 and the surface 15 of the germanium oxynitride layer 7. The surface quality of the germanium oxynitride surface 15 satisfies the bonding criteria with respect to surface roughness (typically below about 10 Å, and in particular below about 5 Å). Thus, nanotopology, site flatness and particle density criteria are all satisfied so that bonding between the two substrates can be achieved without previously polishing the surface 15 of the germanium oxynitride layer 7. This is a major advantage as compared to the prior art process wherein silicon dioxide-like oxides are deposited, then annealed and finally CMP polished.

According to another variant, plasma activation of the germanium oxynitride surface layer can be conducted by performing a plasma activated nitridation of a surface layer having a thickness of about 0 Å to about 20 Å.

FIG. 1f illustrates the result of a detachment step, which in the SMART-CUT® technology includes thermally annealing the source-handle structure 11. During annealing, the predetermined weakened area 9 is weakened until complete detachment between the remainder of the source substrate 21 and the germanium on insulator wafer 17 occurs. The germanium on insulator wafer 17 includes the handle substrate 5, the germanium oxynitride layer 7 and a germanium useful layer 19 which both have been transferred from the original source substrate 10 onto the handle substrate 5. The remainder of the original source substrate 21 is removed and can be reused as source substrate 1 in a subsequent germanium on insulator manufacturing process, after reclaiming it in a manner similar to that used during the SOI SMART-CUT® process.

The present process makes it possible to provide cost-effective germanium on insulator wafers 17 which are, at the same time, of superior quality. The germanium on insulator wafers 17 are of superior quality because of the advantageous characteristics of the germanium oxynitride layer 7 acting as a thermal interface with regard to the germanium wafer of the source substrate, and which has its bonding interface towards the handle substrate 5.

FIGS. 2a to 2f illustrate a second embodiment of the inventive method, wherein an additional layer 23 is provided between the germanium oxynitride layer 7 and the handle substrate 5. The additional layer 23 facilitates bonding by including standard bonding surfaces, for example deposited $SiO_2$ surfaces. The second embodiment includes the same processing steps as the first embodiment, and therefore those steps are not repeated but incorporated herein by reference. In addition, elements having the same reference numeral in FIGS. 1a to 1f and FIGS. 2a to 2f correspond to each other (are alike), and their properties are therefore not repeated but are incorporated by reference.

Referring to FIG. 2a, a layer of $SiO_2$ 23 is deposited on the $GeO_xN_y$ layer 7, prior to the process step illustrated in FIG. 1d. The layer 23 is for example deposited by PECVD based on TEOS or $SiH_4$ at a temperature which is compatible with the germanium material, which is typically less than 700° C. This layer 23 may have a thickness in a range of about a few nanometers to about a few hundreds of nanometers. In this case, the source-handle structure 11', shown in FIG. 2b, includes the layer 23 in addition to the layers shown in the source-handle-structure 11 of FIG. 1e.

The interface between the germanium and the oxide remains a $GeO_xN_y$/Ge interface which, as previously explained, has very good electrical characteristics. The interface between the $GeO_xN_y$ layer 7 and the deposited $SiO_2$ layer 23 is of a lower quality. However, since this interface is relatively far from the germanium useful layer 19, it does not damage the electrical properties of the germanium useful layer 19.

Figure 2C:
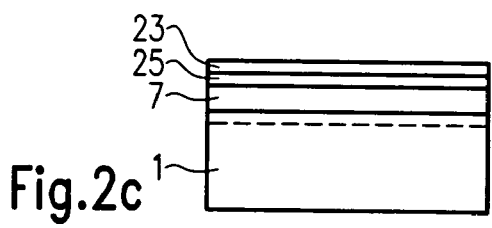
Figure 2D:
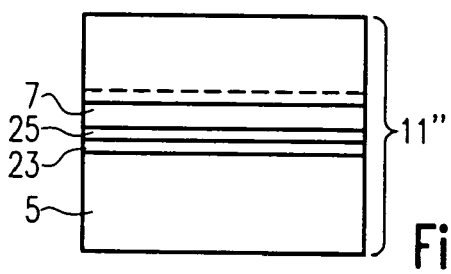

FIG. 2c illustrates another variant, wherein a second additional layer 25 that may be made of $HfO_2$ or $Si_3N_4$, is deposited on the GeOxNy layer 7 prior to providing the $SiO_2$ layer 23. As shown in FIG. 2d, after a bonding step the source-handle structure 11" is obtained, which also now includes the second additional layer 25.

A deposited $SiO_2$ layer has different properties than that of the generally used thermal $SiO_2$ layer. In particular, deposited $SiO_2$ has low resistance to chemical attacks, for example, by attack from fluoric acid HF. This can become a problem when devices are fabricated in the transferred germanium useful layer 19, since the deposited $SiO_2$ layer 23 forms the final buried oxide interface of the GeOI substrate 17. An additional $HfO_2$ or $Si_3N_4$ layer 25 may solve the problem by increasing the resistance to chemical attacks.

Figure 2E:
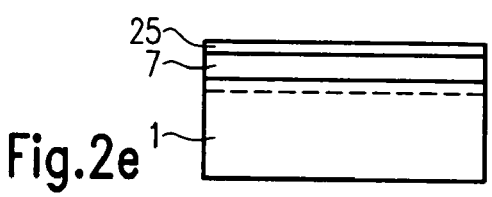
Figure 2F:
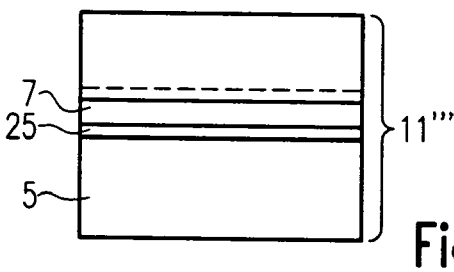

According to a second variant of the second embodiment, the additional layer 23 (which may be a $SiO_2$ layer) is deposited on the $GeO_xN_y$ layer 7 before the ion implantation step illustrated in FIG. 1d. It may be necessary to remove this layer before the bonding step illustrated in FIG. 1e, particularly if only a thermal oxide is required to form the buried oxide of the GeOI substrate 17 to improve the quality of the buried oxide. In this case, it can be advantageous to deposit a second additional layer 25 of $HfO_2$ or $Si_3N_4$ onto the $GeO_xN_y$ layer 7 prior to depositing the $SiO_2$ layer 23. The thickness of this layer could be from about a few nanometers to about a few hundreds of nanometers. This enables the removal of the deposited $SiO_2$ layer after the implantation step, illustrated in FIG. 1d, by chemical attack, for example by using HF. The resulting structure (for example, Ge/$GeO_xN_y$/HfO2), illustrated in FIG. 2e, is then bonded directly to the handle substrate 5 to form a source-handle structure 11''' shown in FIG. 2f. The handle substrate 5 may or not comprise thermal SiO2 on its surface 13.

In all the variants mentioned above, the interface between the germanium and the GeOI dielectric is always a germanium/$GeO_xN_y$ interface. This guarantees good electrical quality of the thin germanium layer 7.

In summary, according to an advantageous embodiment, the method can include creating a predetermined weakened area inside the source substrate before providing a germanium oxynitride layer and attaching the source substrate to the handle substrate. This is advantageous because the interface between the germanium oxynitride and the source substrate is well defined and has good electrical characteristics which ensures that the devices to be constructed on the GeOI wafer will function well. Atomic species, such as helium or hydrogen ions, can be implanted into the source substrate to obtain the predetermined weakened area. Surprisingly, it has been observed that the $GeO_xN_y$ layer, through which implantation occurs, does not loose its advantageous properties.

Advantageously, providing germanium oxynitride may include oxidizing the germanium substrate, or using the native oxide on the source substrate to create the germanium oxide nitride layer by nitridizing the germanium oxide. Thermally oxidizing the germanium substrate can be advantageous. In contrast to deposited layers, a thermally grown oxide layer has the advantage of having better film characteristics such as, for example, improved surface roughness. In addition to thermal oxidation, alternative techniques can be employed to oxidize Ge. For example, electron cyclotron resonance plasma oxidation or plasma anodic oxidation could be used, wherein both use a plasma atmosphere of oxygen. Compared to thermal oxidation, the growth rate can be improved and/or the growth temperature can be lowered. To stabilize the dielectric material obtained, nitridation of the germanium oxide is then conducted to obtain a stable germanium oxynitride layer having the advantageous characteristics described above.

Preferably, at least one of ammonia, nitrogen dioxide or nitrogen monoxide could be used to nitridize the germanium Ge layer to obtain the germanium oxynitride layer. These elements allow nitridation to occur naturally which further reduces production costs. Alternatively, nitridation can be conducted by using a plasma anodic nitridation technique, using a plasma of at least one of ammonia, nitrogen dioxide or nitrogen monoxide. In a further variant, the germanium oxynitride layer is created by using a rapid thermal nitridation process. This process consists of placing a heated germanium substrate, germanium layer or an already oxidized germanium layer in an ammonia atmosphere for a relatively short time.

According to another variant, N or $N_2$ ions are implanted to obtain the germanium oxynitride layer. Such implanting can be used to either directly create the germanium oxynitride layer or to alter the stoichiometry of an already formed germanium oxynitride layer. By adapting the dose and energy of the ions various germanium oxynitrides can be obtained, from stoichiometric $GeN_2O$ to non-stoichiometric $GeN_xO_y$, thereby allowing enhanced freedom to create different types of germanium oxynitride layers depending on the requirements of the final product. Providing the germanium oxynitride layer preferably also includes cleaning the germanium surface, in particular by using cyclic fluoric acid (CHF). Cleaning the surface of the germanium substrate improves the interface quality of the germanium oxynitride interface to further improve the electrical characteristics of the germanium on insulator wafer.

According to a preferred embodiment, before the source substrate is attached to the handle substrate, a surface layer of the germanium oxynitride ($GeO_xN_y$) layer having a thickness of about 0 Å to 20 Å can be activated by plasma activation. By using plasma activation, the surface chemistry of the germanium oxynitride layer can be tailored to allow formation of stronger chemical bonds than can be achieved for non-activated surfaces that are to be attached (bonded) to the handle substrate. Plasma activation can be accomplished by using a plasma activated nitridation process. This results in a decrease of the annealing temperature and annealing time for the fabrication of the final product.

Advantageously, the handle substrate is made of one of germanium, silicon, silicon dioxide on silicon (thermally grown), silicon carbide, gallium arsenide or quartz. These materials bond well with a $GeO_xN_y$ layer. Therefore, a plurality of different germanium on insulator wafers can be obtained by using the same method since the germanium oxynitride layer is grown on the germanium wafer or on the germanium layer that includes the source substrate itself. The method can further advantageously include providing an additional layer, in particular a deposited silicon dioxide ($SiO_2$) layer, on the $GeO_xN_y$ layer prior to forming the source-handle-compound. This additional layer can be used to facilitate the attachment step, because the surface provided for bonding is a standard surface for bonding technology. Preferably, a second additional layer, in particular a $HfO_2$ or $Si_3N_4$ layer, can be provided on the $GeO_xN_y$ layer prior to providing the additional layer. This second additional layer provides increased resistance against chemical attacks for the GeOI wafer. The role of the $GeO_xN_y$ layer in such a structure assures good electrical characteristics.

Advantageously, the additional layer can be provided prior to preparing the predetermined weakened area. This step can be used to optimize the creation of the predetermined weakened area, as the energy level for implanting ions can be freely chosen. According to another variant the additional layer can be removed before forming the source-handle structure, in the case where the presence of a deposited oxide layer is not suitable for the electrical quality of the buried oxide layer. Removing the additional layer prior to the forming the source-handle structure is advantageous because any damage on the surface that may occur during ion implantation will not detrimentally affect the quality of the final product.

The invention furthermore relates to a germanium on insulator (GeOI) wafer fabricated according to the methods described above.

What is claimed is:

1. A method for fabricating a germanium on insulator wafer comprising:
    providing a source substrate having a surface, at least a layer of germanium and a weakened area that is located at a predetermined depth in the germanium layer of the source substrate, with the weakened area being generally parallel to the source substrate surface;
    providing a germanium oxynitride layer in or on the germanium layer on the source substrate to enhance the electrical properties of the germanium layer;
    providing at least one additional layer on the germanium oxynitride layer as an exposed layer of the source substrate;
    bonding the exposed layer of the source substrate surface to a handle substrate to form a source-handle structure; and
    detaching the source substrate from the source-handle structure at the weakened area of the source substrate to create the germanium on insulator wafer having, as a surface, a useful layer of germanium.

2. The method of claim 1, wherein the source substrate is entirely made of germanium.

3. The method of claim 1, which further comprises creating the predetermined weakened area prior to the bonding step by implanting atomic species through the source substrate surface.

4. The method of claim 1 wherein the germanium oxynitride layer is provided by treating the surface of the source substrate, wherein the surface is germanium oxide, followed by a treatment to introduce nitrogen into the germanium oxide layer.

5. The method of claim 4, wherein the germanium oxynitride layer is formed using a rapid thermal nitridation process.

6. The method of claim 5, wherein the rapid thermal nitridation process includes heating the source substrate in an ammonia atmosphere at about 600° C. for about 1 minute.

7. The method of claim 1, wherein the surface of the source substrate is germanium and the germanium oxynitride layer is provided by first forming a germanium oxide layer on the germanium surface, followed by a treatment to introduce nitrogen into the germanium oxide layer.

8. The method of claim 7, wherein the germanium oxide layer is formed by thermally growing the germanium oxide layer on germanium, by oxidizing the germanium surface or by allowing a native germanium oxide layer to form by contact of the germanium surface with ambient air.

9. The method of claim 8, wherein the germanium oxynitride layer is provided by applying a nitridation process to the germanium oxide layer.

10. The method of claim 9, wherein the nitridation process includes applying at least one of ammonia, $NO_2$, or NO to the germanium oxide layer.

11. The method of claim 7, which further comprises cleaning the germanium surface with cyclic fluoric acid prior to forming the germanium oxide layer.

12. The method of claim 1, which further comprises implanting at least one of N ions or $N_2$ ions into the germanium oxynitride layer.

13. The method of claim 1, which further comprises, prior to bonding, activating a surface of the germanium oxynitride layer by plasma activation.

14. The method of claim 1, wherein the germanium surface has a thickness of no greater than about 20 Å.

15. The method of claim 1, wherein the handle substrate is made of at least one of germanium, silicon, thermally grown silicon dioxide on silicon, silicon carbide, gallium arsenide, or quartz.

16. The method of claim 1, wherein the additional layer is a deposited silicon dioxide layer and is provided prior to preparing the predetermined weakened area.

17. The method of claim 16, wherein a second additional layer is provided on the germanium oxynitride layer prior to providing the additional layer.

18. The method of claim 17, wherein the second additional layer is at least one of $HfO_2$ or $Si_3N_4$.

19. A germanium on insulator wafer comprising a germanium useful layer, a germanium oxynitride layer, a handle substrate, and an additional layer made of $SiO_2$ and positioned between the germanium oxynitride layer and the handle substrate, whereby electrical properties of the germanium useful layer is improved.

20. The germanium on insulator wafer of claim 19, further comprising a second additional layer at least one of $HfO_2$ or $Si_3N_4$ positioned between the germanium oxynitride layer and the additional layer.

* * * * *